(12) United States Patent
Wuister et al.

(10) Patent No.: US 8,144,309 B2
(45) Date of Patent: Mar. 27, 2012

(54) IMPRINT LITHOGRAPHY

(75) Inventors: Sander Frederik Wuister, Eindhoven (NL); Johan Frederik Dijksman, Weert (NL); Yvonne Wendela Kruijt-Stegeman, Eindhoven (NL); Ivar Schram, Weert (NL); Jeroen Herman Lammers, Eindhoven (NL); Richard Joseph Marinus Schroeders, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1238 days.

(21) Appl. No.: 11/896,750

(22) Filed: Sep. 5, 2007

(65) Prior Publication Data

US 2009/0057267 A1   Mar. 5, 2009

(51) Int. Cl.
   *G03B 27/58* (2006.01)
(52) U.S. Cl. ............ 355/72; 269/287; 269/21; 269/903; 355/75
(58) Field of Classification Search .................. 269/309, 269/287, 21, 903, 900; 451/397, 398; 435/385; 216/52; 355/72, 75; 101/407.1, 474
   See application file for complete search history.

(56) References Cited

U.S. PATENT DOCUMENTS

| | | | |
|---|---|---|---|
| 2,366,935 A * | 1/1945 | Schmid .................. 451/388 |
| 3,765,289 A * | 10/1973 | Gerber et al. .................. 83/452 |
| 4,183,545 A * | 1/1980 | Daly .................. 279/3 |
| 4,731,155 A | 3/1988 | Napoli et al. .................. 156/643 |
| 4,955,590 A * | 9/1990 | Narushima et al. ............. 269/21 |
| 4,981,345 A * | 1/1991 | Berry et al. .................. 359/391 |
| 5,417,408 A * | 5/1995 | Ueda .................. 269/21 |
| 5,512,131 A | 4/1996 | Kumar et al. ............. 156/655.1 |
| 5,658,190 A * | 8/1997 | Wright et al. .................. 451/285 |
| 5,693,182 A * | 12/1997 | Mathuni .................. 438/727 |
| 5,772,905 A | 6/1998 | Chou .................. 216/44 |
| 5,827,786 A * | 10/1998 | Puretz .................. 438/789 |
| 5,882,248 A * | 3/1999 | Wright et al. .................. 451/285 |
| 5,944,590 A * | 8/1999 | Isobe et al. .................. 451/288 |
| 6,027,605 A * | 2/2000 | Lehmann et al. ........ 156/345.26 |
| 6,146,256 A * | 11/2000 | Joo .................. 451/285 |
| 6,165,911 A | 12/2000 | Calveley .................. 438/754 |
| 6,173,648 B1 * | 1/2001 | Misono et al. .................. 101/474 |
| 6,180,239 B1 | 1/2001 | Whitesides et al. ........ 428/411.1 |
| 6,309,580 B1 | 10/2001 | Chou .................. 264/338 |
| 6,334,960 B1 | 1/2002 | Willson et al. .................. 216/52 |

(Continued)

FOREIGN PATENT DOCUMENTS

JP    63312035 A  *  12/1988

(Continued)

OTHER PUBLICATIONS

Stephen Y. Chou, et al., "Nanoimprint Lithography", J. Vac. Sci. Technol. B 14(6), Nov./Dec. 1996, pp. 4129-4133.

(Continued)

*Primary Examiner* — George Nguyen
(74) *Attorney, Agent, or Firm* — Pillsbury Winthrop Shaw Pittman LLP

(57) ABSTRACT

A chuck apparatus for holding a substrate is the disclosed. The chuck apparatus includes a first surface portion on which the substrate is to be held and a second surface portion adjacent to the first surface portion and extending at least partially around an edge of the first surface portion and which, in use, is arranged to deflect gas over the first surface portion and thus the substrate that is to be held on the first surface portion.

20 Claims, 7 Drawing Sheets

U.S. PATENT DOCUMENTS

| | | | |
|---|---|---|---|
| 6,343,784 B1* | 2/2002 | Jourde et al. | 269/287 |
| 6,365,059 B1 | 4/2002 | Pechenik | 216/52 |
| 6,375,870 B1 | 4/2002 | Visovsky et al. | 264/1.31 |
| 6,443,810 B1* | 9/2002 | Shih | 451/41 |
| 6,482,742 B1 | 11/2002 | Chou | 438/690 |
| 6,514,123 B1* | 2/2003 | Crevasse et al. | 451/28 |
| 6,518,189 B1 | 2/2003 | Chou | 438/706 |
| 6,538,719 B1* | 3/2003 | Takahashi et al. | 355/53 |
| 6,642,996 B2 | 11/2003 | Nogawa | |
| 6,656,341 B2 | 12/2003 | Petersson et al. | 205/667 |
| 6,696,220 B2 | 2/2004 | Bailey et al. | 430/272.1 |
| 6,719,915 B2 | 4/2004 | Willson et al. | 216/44 |
| 6,921,615 B2 | 7/2005 | Sreenivasan et al. | 430/22 |
| 7,090,716 B2 | 8/2006 | McMackin et al. | |
| 7,367,552 B2* | 5/2008 | Greber | 269/309 |
| 7,377,764 B2 | 5/2008 | Kruijt-Stegeman et al. | |
| 2002/0057423 A1 | 5/2002 | Nogawa | |
| 2002/0093122 A1 | 7/2002 | Choi et al. | 264/401 |
| 2002/0094496 A1 | 7/2002 | Choi et al. | 430/322 |
| 2002/0132482 A1 | 9/2002 | Chou | 438/692 |
| 2002/0167117 A1 | 11/2002 | Chou | 264/338 |
| 2002/0177319 A1 | 11/2002 | Chou | 438/690 |
| 2003/0034329 A1 | 2/2003 | Chou | 216/44 |
| 2003/0070620 A1* | 4/2003 | Cooperberg et al. | 118/723 AN |
| 2003/0080471 A1 | 5/2003 | Chou | 264/338 |
| 2003/0080472 A1 | 5/2003 | Chou | 264/338 |
| 2003/0081193 A1 | 5/2003 | White et al. | 355/72 |
| 2003/0127580 A1 | 7/2003 | Ling et al. | 249/115 |
| 2003/0139042 A1 | 7/2003 | Heidari | 438/689 |
| 2003/0141291 A1 | 7/2003 | Heidari et al. | 219/460.1 |
| 2003/0159608 A1 | 8/2003 | Heidari | 101/494 |
| 2003/0170053 A1 | 9/2003 | Montelius et al. | 399/318 |
| 2003/0189273 A1 | 10/2003 | Olsson | 264/293 |
| 2003/0200925 A1* | 10/2003 | Vaartstra | 118/715 |
| 2004/0005444 A1 | 1/2004 | Heidari | 428/212 |
| 2004/0009673 A1 | 1/2004 | Sreenivasan et al. | 438/694 |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0046288 A1 | 3/2004 | Chou | 264/479 |
| 2004/0081798 A1 | 4/2004 | Lee et al. | 428/141 |
| 2004/0124566 A1 | 7/2004 | Sreenivasan et al. | 264/494 |
| 2004/0149367 A1 | 8/2004 | Olsson et al. | 156/64 |
| 2004/0169003 A1 | 9/2004 | Lee et al. | 216/4 |
| 2004/0185200 A1* | 9/2004 | Neculescu et al. | 428/35.7 |
| 2004/0192041 A1 | 9/2004 | Jeong et al. | 438/689 |
| 2004/0200411 A1 | 10/2004 | Willson et al. | 118/500 |
| 2004/0209470 A1 | 10/2004 | Bajorek | 438/689 |
| 2004/0219249 A1 | 11/2004 | Chung et al. | 425/385 |
| 2004/0219461 A1 | 11/2004 | Chung et al. | 430/311 |
| 2005/0039618 A1 | 2/2005 | Heidari et al. | 101/368 |
| 2005/0064054 A1 | 3/2005 | Kasumi | 425/112 |
| 2005/0072755 A1 | 4/2005 | McMackin et al. | |
| 2005/0074512 A1 | 4/2005 | McMackin et al. | |
| 2005/0159019 A1 | 7/2005 | Lee | 438/800 |
| 2005/0274693 A1 | 12/2005 | Heidari et al. | 216/52 |
| 2006/0280829 A1 | 12/2006 | Kruijt-Stegeman et al. | |

FOREIGN PATENT DOCUMENTS

| | | |
|---|---|---|
| JP | 07-321000 | 12/1995 |
| JP | 2002-158154 | 5/2002 |
| JP | 2006-352121 | 12/2006 |
| JP | 2007-098779 | 4/2007 |
| WO | WO 01/79591 A1 | 10/2001 |
| WO | WO 01/79592 A1 | 10/2001 |
| WO | WO 02/067055 A2 | 8/2002 |
| WO | 2005/033797 | 4/2005 |

OTHER PUBLICATIONS

Jan Haisma, et al., "Mold-Assisted Nanolithography: A Process for Reliable Pattern Replication," J. Vac. Sci. Technol. B 14(6), Nov./Dec. 1996, pp. 4124-4128.

Japanese Office Action mailed Mar. 2, 2011 in corresponding Japanese patent application No. 2008-211243.

* cited by examiner ns used in hot imprint lithography processes are poly (methyl methacrylate), polystyrene, poly (benzyl methacrylate) or poly (cyclohexyl methacrylate). For more information on hot imprint, see for example U.S. Pat. Nos. 4,731,155 and 5,772, 905.

FIG. 1c shows an example of UV imprint lithography, which involves the use of a transparent template and a UV-curable liquid (the term "UV" is used here for convenience but should be interpreted as including any suitable actinic radiation for curing). An UV curable liquid is often less viscous than the thermosetting and thermoplastic resins used in hot imprint lithography and consequently may move much faster to fill template pattern features. A quartz template 16 is applied to a UV-curable resin 17 in a similar manner to the process of FIG. 1b. However, instead of using heat or temperature cycling as in hot imprint, the pattern is frozen by curing the resin with UV radiation that is applied through the quartz template onto the resin. After removal of the template, the pattern will consist of the features in relief from a residual layer of the resin which may then be removed by an appropriate etch process to leave only the pattern features. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see for example United States patent application publication no. 2004-0124566, U.S. Pat. No. 6,334,960, PCT patent application publication no. WO 02/067055, and the article by J. Haisma entitled "Mold-assisted nanolithography: A process for reliable pattern replication", J. Vac. Sci. Technol. B14(6), November/December 1996.

Combinations of all or parts of the above imprint techniques are also possible. See, for example, United States patent application publication no. 2005-0274693, which mentions a combination of heating and UV curing an imprint material.

IMPRINT LITHOGRAPHY

FIELD

The present invention relates to imprint lithography.

BACKGROUND

In lithography, there is an ongoing desire to reduce the size of features in a lithographic pattern to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a "stamp" to transfer a pattern onto a substrate. An advantage of imprint lithography is that the resolution of the features is not limited by, for example, the wavelength of a radiation source or the numerical aperture of a projection system as in photolithography, but mainly just by the pattern density on the stamp (also referred to as a template). There are three main approaches to imprint lithography, examples of which are schematically depicted in FIGS. 1a to 1c.

FIG. 1a shows an example of a type of imprint lithography that is often referred to as micro-contact printing. Micro-contact printing involves transferring a layer of molecules 11 (typically an ink such as a thiol) from a template 10 (for example a polydimethylsiloxane template) onto a resist layer 13 which is supported by a substrate 12 and planarization and transfer layer 12'. The template 10 has a pattern of features on its surface, the molecular layer being disposed upon the features. When the template is pressed against the resist layer, the layer of molecules 11 are transferred onto the resist. After removal of the template, the resist is etched such that the areas of the resist not covered by the transferred molecular layer are etched down to the substrate. For more information on micro-contact printing, see, for example, U.S. Pat. No. 6,180,239.

FIG. 1b shows an example of so-called hot imprint lithography (or hot embossing). In a typical hot imprint process, a template 14 is imprinted into a thermosetting or a thermoplastic polymer resin 15, which has been cast on the surface of a substrate 12. The resin may for instance be spin coated and baked onto the substrate surface or, as in the example illustrated, onto a planarization and transfer layer 12'. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template may then be removed and the patterned resin cooled. In hot imprint lithography employing a layer of thermoplastic polymer resin, the thermoplastic resin is heated so that it is in a freely flowable state immediately prior to imprinting with the template. It may be necessary to heat a thermoplastic resin to a temperature considerably above the glass transition temperature of the resin. The template is pressed into the flowable resin and then cooled to below its glass transition temperature with the template in place to harden the pattern. Thereafter, the template is removed. The pattern will consist of the features in relief from a residual layer of the resin which may then be removed by an appropriate etch process to leave only the pattern features. Examples of thermoplastic polymer res-

SUMMARY

When an imprint template is pushed into or against a surface into which a pattern is to be imprinted (for example, a layer of resist or other imprintable medium), gas (e.g., air) may become trapped between the imprint template and the imprintable medium, and/or be trapped in bubbles in the imprintable medium itself. Trapped gas, often referred to as gas inclusions (e.g., air inclusions), can lead to defects in the imprinted pattern. Therefore, it is desirable to reduce or eliminate gas inclusions.

It is desirable, for example, to provide an apparatus and method which obviates or mitigates at least one disadvantage of the prior art, whether identified herein or elsewhere.

According to an aspect of the invention, there is provided a chuck apparatus for holding a substrate, wherein the chuck apparatus comprises: a first surface portion on which the substrate is to be held; and a second surface portion adjacent to the first surface portion and extending at least partially around an edge of the first surface portion and which, in use, is arranged to deflect gas over the first surface portion and thus the substrate that is to be held on the first surface portion.

According to an aspect of the invention, there is provided a method of directing gas over a substrate using a chuck apparatus, the chuck apparatus comprising a first surface portion on which the substrate is holdable; and a second surface portion adjacent to the first surface portion and extending at least partially around an edge of the first surface portion; the method comprising: directing gas at the second surface portion, the second surface portion deflecting gas over the substrate.

According to an aspect of the invention, there is provided an imprint lithography apparatus, comprising: an imprint template; a gas delivery apparatus arranged to deliver gas in the direction of a normal vector extending from a patterned surface of the imprint template such that, in use, gas is directed in between the imprint template and a surface which the imprint template is to be brought into contact with.

According to an aspect of the invention, there is provided a method of delivering gas relative to an imprint template, the method comprising: delivering gas in the direction of a normal vector extending from a patterned surface of the imprint template such that, in use, gas is directed in between the imprint template and a surface which the imprint template is to be brought into contact with.

DETAILED DESCRIPTION

Figure 1A:
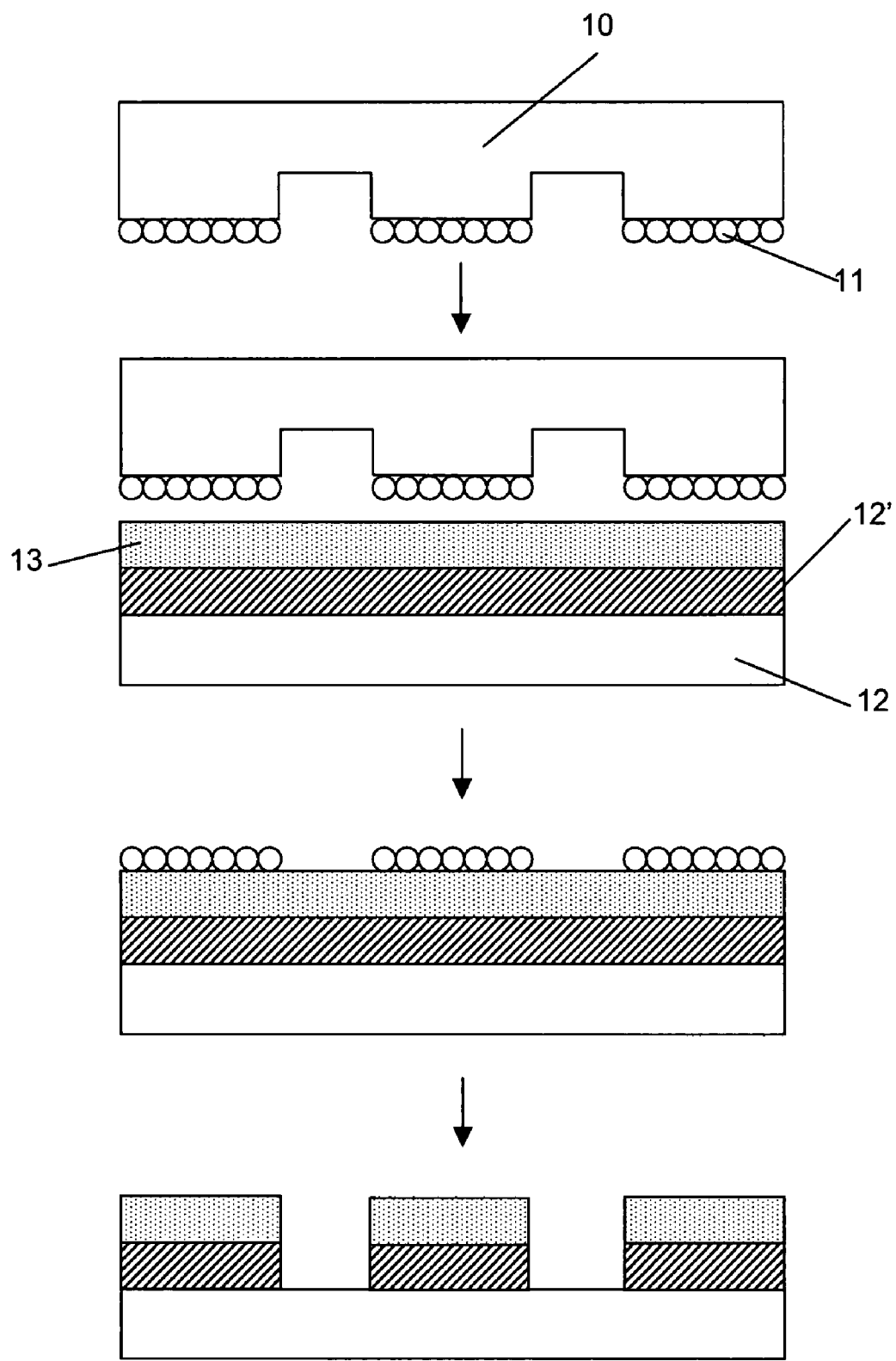
FIGS. 1a-c schematically shows examples of, respectively, micro-contact printing, hot imprint, and UV imprint.
Figure 1B:
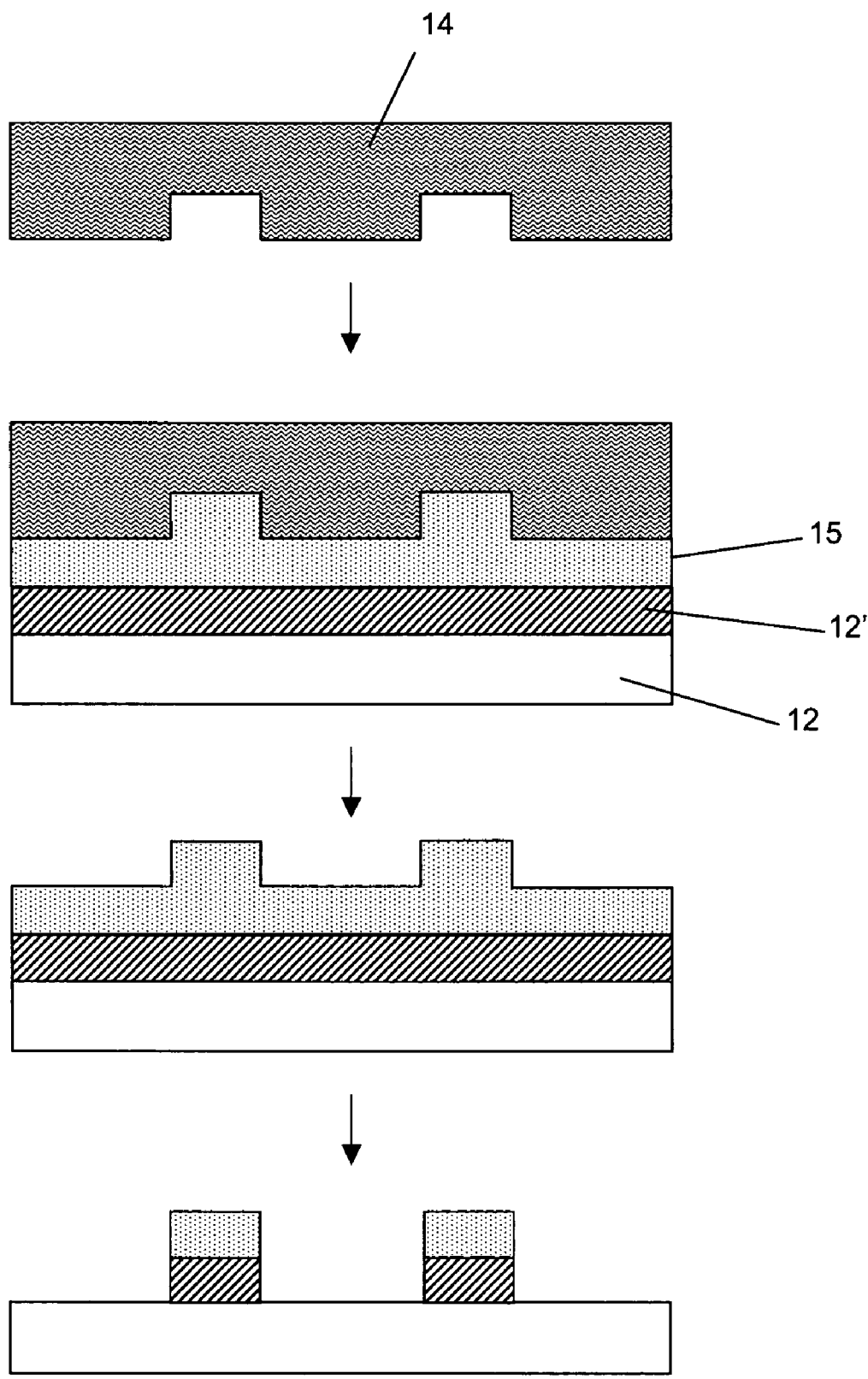
Figure 1C:
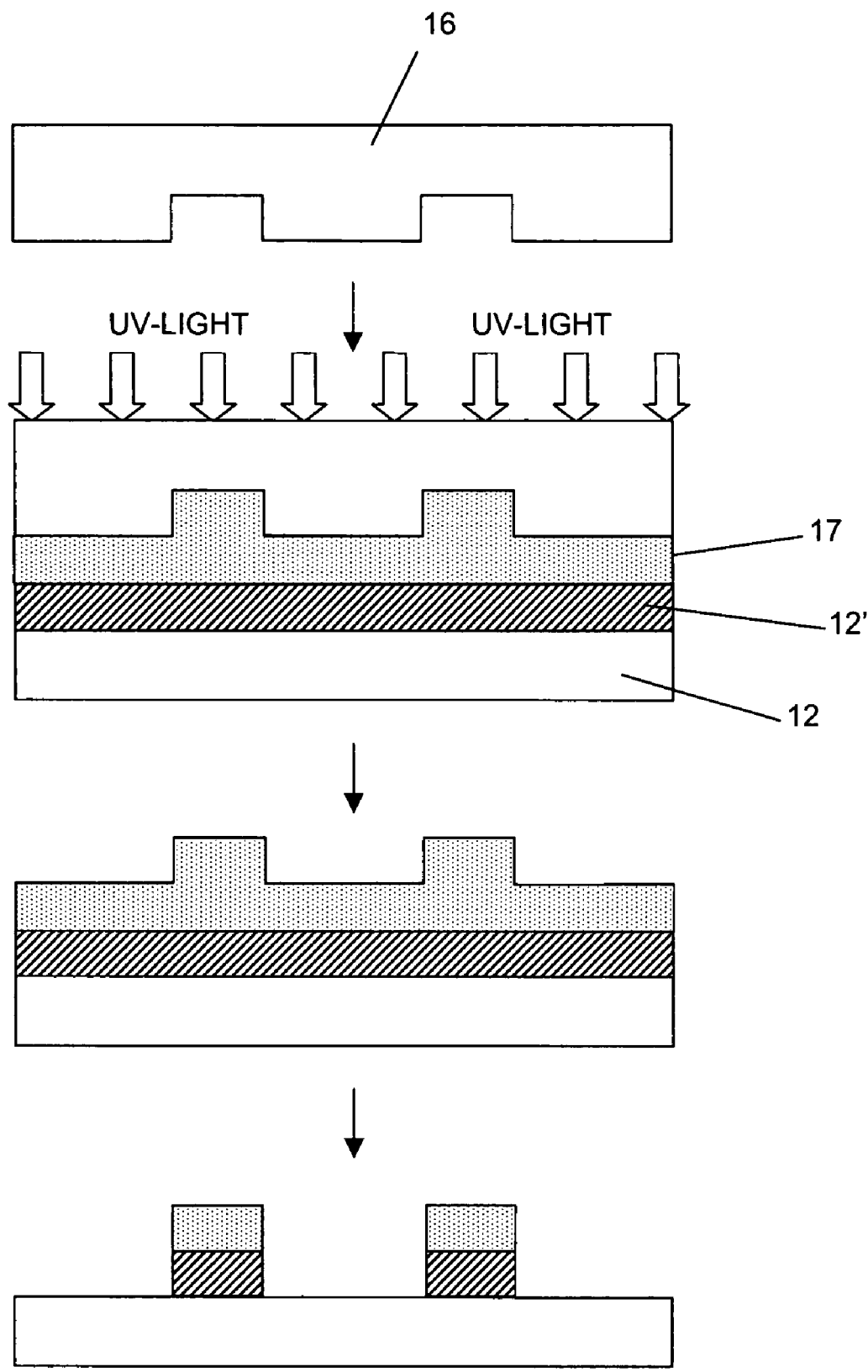
Figure 2A:
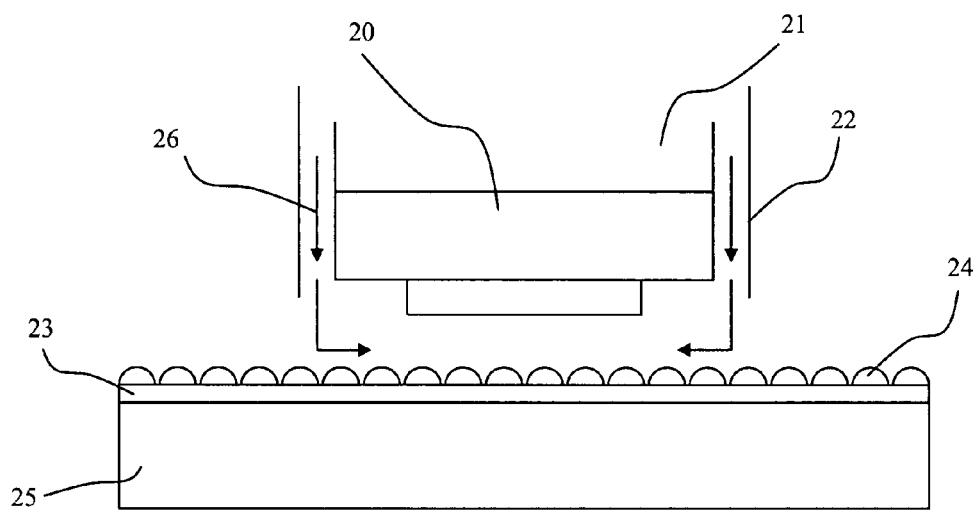
FIGS. 2a-2b depict an imprint lithography apparatus and method.

FIG. 2a schematically depicts an imprint lithography apparatus. An imprint template 20 is held in position by an imprint template chuck 21. The imprint template 20 may be moved about via movement of the imprint template chuck 21. One or more conduits 22 are provided which run alongside the imprint template chuck 21 and imprint template 20. The conduit(s) 22 opens adjacent to the imprint template 20. Although FIG. 2a shows two conduits 22 extending along two sides of the imprint template 20, more (or less) conduits may extend alongside the imprint template 20. For example, one or more conduits may be used which extend around the imprint template 20 and imprint template chuck 21, and which open adjacent to the imprint template 20.

FIG. 2a also shows a substrate 23 provided with a layer of imprintable medium 24 (for example, resist). The substrate 23 is held in position by a chuck 25. As can be seen from FIG. 2a, it is conventional in imprint lithography arrangements for the chuck 25 to be substantially equal in width and perimeter (e.g., diameter and circumference) to the substrate 23, such that the edge(s) of the substrate 23 is in alignment with the edge(s) of the substrate chuck 25. In an embodiment, the chuck 25 is, is attached to or is an integral part of a substrate table (not shown for clarity). In an embodiment, the chuck 25 may be an intermediate substrate carrier, which may be used as an intermediate structure to carry the substrate and hold it in position. The substrate carrier itself is then held in position on the substrate table (not shown for clarity). The term "chuck" used herein is intended to cover both the (intermediate) substrate carrier and the substrate table as mentioned previously.

In use, the imprint template 20 is typically moved towards and brought into contact with the imprintable medium 24 provided on the substrate 23. As the imprint template 20 is brought into contact with the imprintable medium 24, gas 26 is passed through the conduit(s) 22. Alternatively, the gas 26 may be continuously passed through the conduit(s) 22. It can be seen from FIGS. 2a-b that the gas passes along the conduit (s) 22 and against the imprintable medium 24. A portion of the gas 26 will be deflected by the imprintable medium 24 and the substrate 23 and will pass between the imprint template 20 and the imprintable medium 24 which is about to be imprinted by the imprint template 20. The gas is used to accelerate the dissolution of gas inclusions between the imprint template 20 and the imprintable medium 24, and also gas inclusions in the imprintable medium 24. Where, for example, the imprint environment is air, a suitable gas 26 to be used is helium, although other gases such as nitrogen, carbon, hydrogen and xenon may also be used.

Figure 2B:
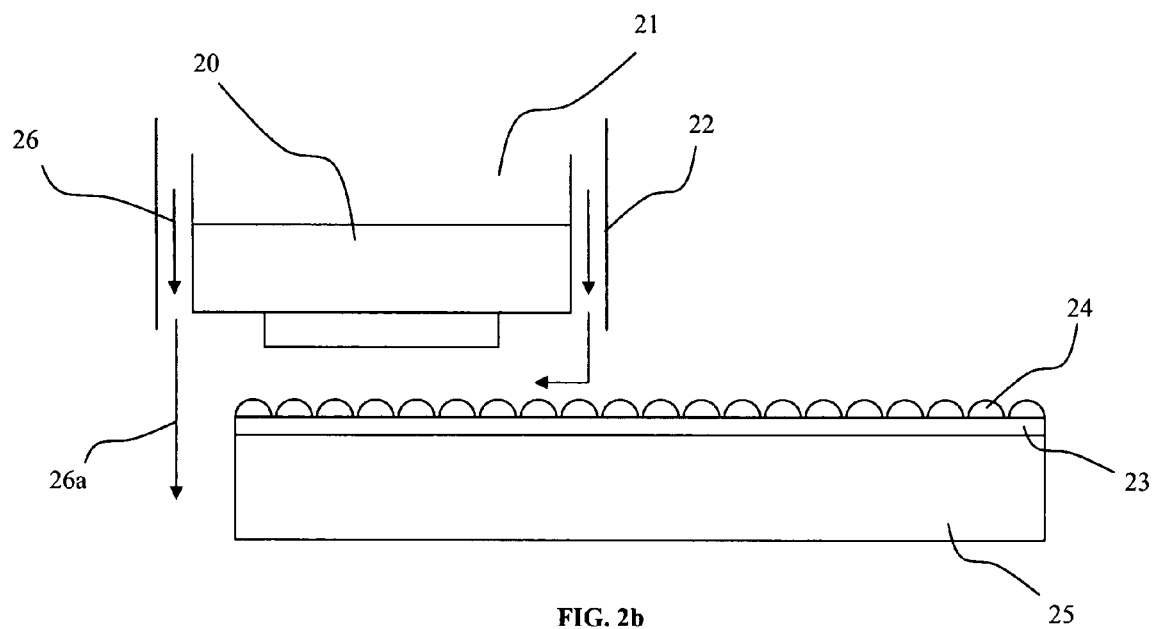

In FIG. 2a, it can be seen that when a pattern is to be imprinted away from the edge of the substrate 23 (e.g. in or around the center of the substrate 23), the gas 26 is deflected between the imprint template 20 and the imprintable medium 24. Referring now to FIG. 2b, it can be seen that when a pattern is to be imprinted in the imprintable medium 24 adjacent to the periphery of the substrate 23 (i.e. near the edge of the substrate), less gas is deflected by the substrate into the region between the imprint template 20 and the imprintable medium 24. Specifically, it can be seen that a portion of the gas 26a is not reflected by the substrate, and instead passes by the substrate 23, and passes alongside the edge of the substrate 23 and chuck 25. This portion of the gas 26a is thus not used to accelerate the dissolution of gas inclusions. Because this gas portion 26a is not deflected between the imprint template 20 and the imprintable medium 24, the risk of gas inclusions remaining in the imprintable medium 24 is increased, or at the very least the time taken for the gas inclusions to dissolve is increased. If the gas inclusions are not eliminated or reduced, the pattern in which the gas inclusions are present may be defective. If the time taken for the gas inclusions to dissolve is increased, further processing of the imprinted pattern may be delayed causing a reduction in throughput. It is therefore desirable to reduce or eliminate the possibility of gas inclusions forming, and if they do form, reduce the time taken for the gas inclusions to dissolve.

Figure 3A:
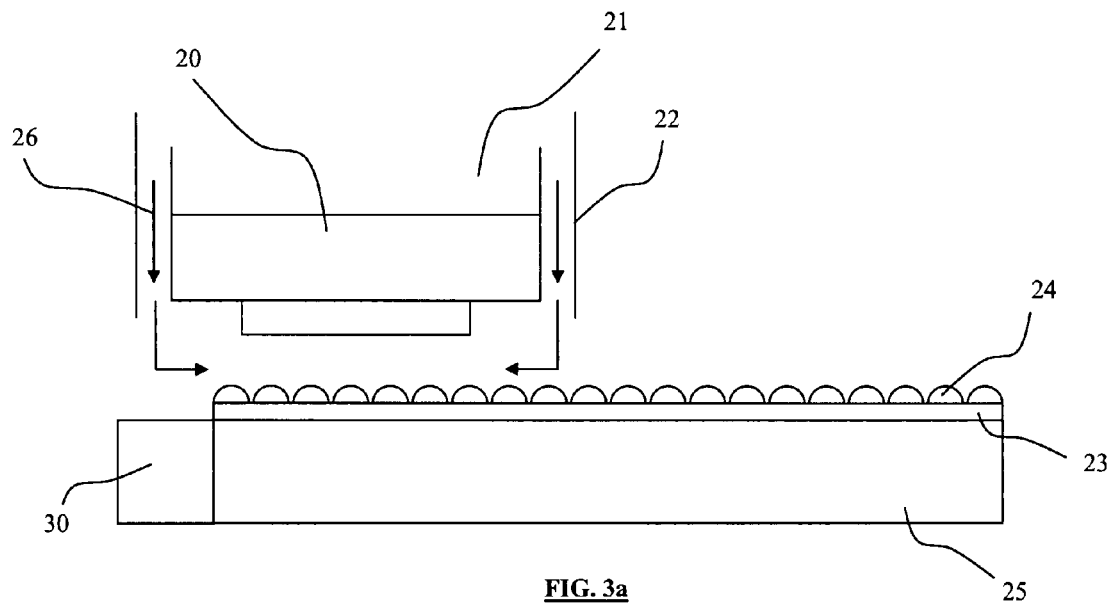
FIGS. 3a-3b depict an imprint lithography apparatus and method according to one or more embodiments of the invention.

FIG. 3a depicts an embodiment of the present invention. FIG. 3a shows that the chuck 25 has been extended by the provision of an extension 30. The extension 30 may be formed from any suitable material, for example, the same material as the chuck 25. It can be seen from FIG. 3a that the extension 30 serves to deflect gas 26 between the imprint template 20 and the imprintable medium 24 even when a pattern has been imprinted on the periphery of the substrate 23. In other words, FIG. 3a depicts a chuck apparatus (i.e. an apparatus comprising a chuck) provided with two surface portions: a first surface portion on which a substrate may be held, and a second surface portion which, in use, is used to deflect gas between the imprint template and the substrate (and imprintable medium). It can be seen that the extension 30 extends away from the edge of the chuck 25 and substrate 23. The extension 30 may extend by any suitable amount. To a limit, the further that the extension 30 extends away from the chuck 25, the more likely it is that gas 26 may be deflected between the imprint template 20 and the imprintable medium 24. However, up to a certain distance away from the substrate 23 and chuck 25, any increase in the degree to which the extension 30 extends away from the chuck 25 will have little effect. Suitable ranges for the distance which the extension 30 extends away from the chuck 25 and substrate 23 are 0.1 cm to 100 cm, and 1 cm to 5 cm may be advantageous.

Figure 3B:
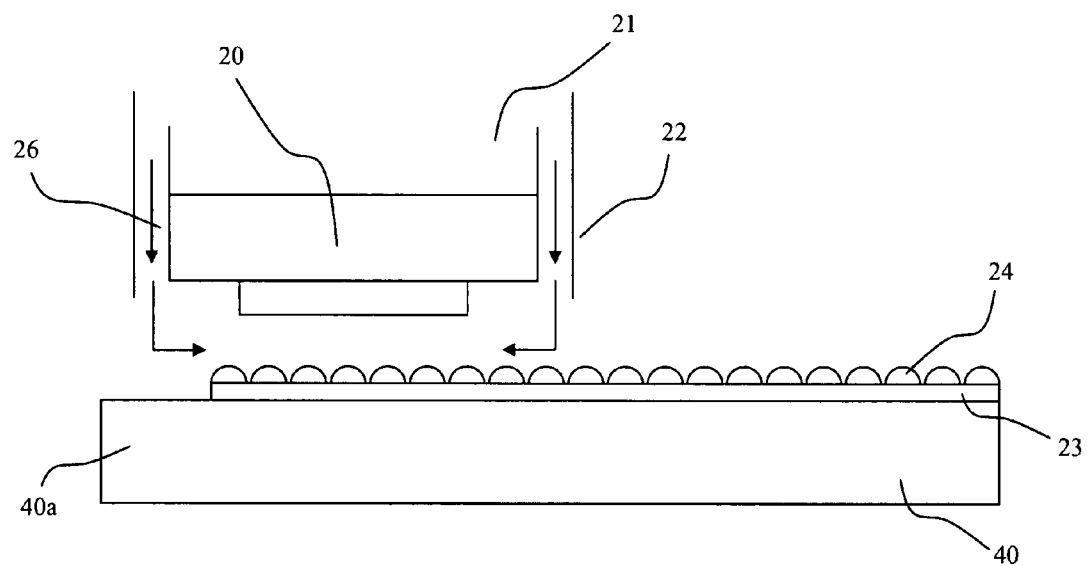

FIG. 3a shows that an extension is provided on one side of the chuck 25 and substrate 23. In practice, it is likely that an extension will be provided at various points around the chuck 25, and that the extension may be provided continuously on the chuck 25. For example, the extension 30 may be a ring (or similar) of material which surrounds the chuck 25. Alternatively, instead of providing an independent extension 30, a larger chuck may be used to hold the substrate. FIG. 3b shows that a chuck 40 has been used to hold the substrate 23, and that the chuck 40 extends beyond the edge(s) of the substrate 23. Although FIG. 3b depicts the chuck 40 having a region 40a which extends beyond an edge of the substrate 23, it is likely that in practice the chuck 40 would be provided with more than one region which extends beyond an edge of the substrate 23, and desirably a region which extends beyond all the edge(s) of the substrate 23. For example, the chuck 23 may have a larger diameter than the substrate 23 which it is designed to hold.

In use, it can be seen from FIG. 3b that even when patterns are imprinted on an edge of the substrate 23, gas 26 is deflected by the region 40a which extends beyond the edge of the substrate 23, so that the gas is directed between the imprint template 20 and the substrate 23.

In summary, it can be seen that the embodiments of FIGS. 3a and 3b improve the delivery of gas between the imprint template 20 and the substrate 23 at an edge of the substrate 23. This is because the extension (or extended region) may be used to, in use, direct gas toward (i.e. in the direction of) a normal vector extending from the chuck (and/or the substrate if carried by the chuck).

Figure 4A:
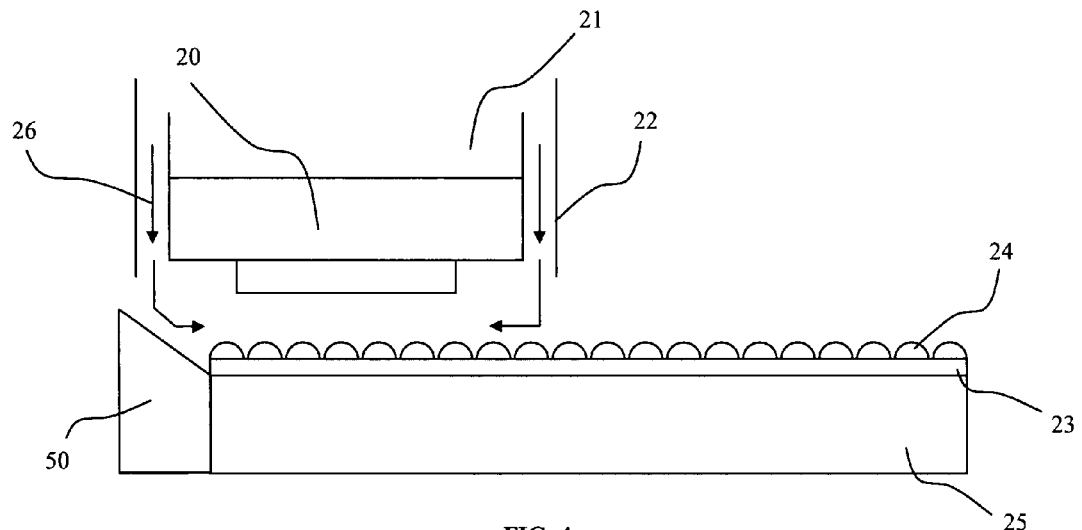
FIGS. 4a-4b depict an imprint lithography apparatus and method according to one or more embodiments of the invention.

FIG. 4a depicts a further embodiment of the present invention. In this embodiment, it can be seen that the chuck 25 has been provided with a shaped extension 50. The shaped extension 50 is provided adjacent to the edge of the chuck 25 and substrate 23. It can be seen that the shaped section 50 has an angled face which is angled towards the chuck 25 and substrate 23. The shaped extension 50 is shaped and sized so that it does not make physical contact with the imprint template 20 during imprinting.

In use, it can be seen from the FIG. 4a that gas 26 which leaves the conduit(s) 22, and which is directed outside of an edge of the substrate 23 and chuck 25 is deflected between the imprint template 20 and the imprintable medium 24 by the shaped extension 50. In other words, FIG. 4a depicts a chuck apparatus (i.e. an apparatus comprising a chuck) provided with two surface portions: a first surface portion on which a substrate may be held, and a second surface portion which, in use, is used to deflect gas between the imprint template and the substrate (and imprintable medium). The shaped extension 50 reduces the amount of wasted gas 26, and increases the amount of gas 26 deflected between the imprint template 20 and the substrate 23. Therefore, using the embodiment of the invention, gas inclusions may be eliminated, reduced in number, and/or the time taken for gas inclusions to dissolve may be reduced.

Figure 4B:
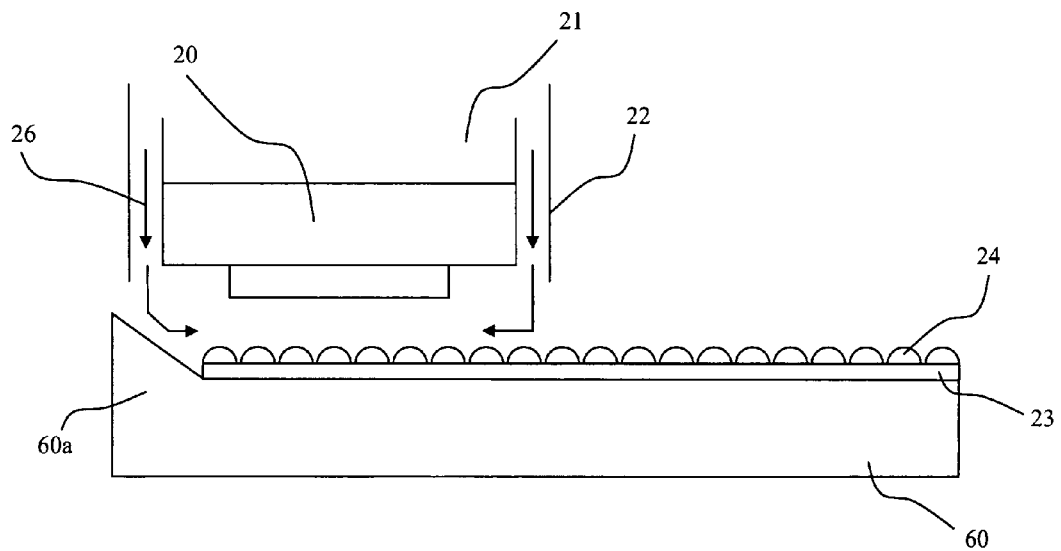

FIG. 4b depicts an embodiment similar to that described in relation to FIG. 4a. Referring to FIG. 4b, it can be seen that a chuck 60 is provided which extends beyond an edge of the substrate 23. That is, for example, the chuck 60 has a greater diameter than the substrate 23. It can be seen that the chuck 60 is provided with an integral shaped section 60a which, as described above in relation to FIG. 4a, is, in use, used to deflect gas 26 between the imprint template 20 and the imprintable medium 24. The integral shaped section 60a is shaped and sized so that it does not make physical contact with the imprint template 20 during imprinting. The integral shaped section 60a reduces the amounts of wasted gas 26, and increases the amount of gas 26 deflected between the imprint template 20 and the substrate 23. Therefore, using the embodiment of the invention, gas inclusions may be eliminated, reduced in number, and/or the time taken for gas inclusions to dissolve may be reduced.

In FIGS. 4a and 4b, the shaped section or extension is only shown on one side of the chuck and substrate. It will however be appreciated that the shaped section or extension may be provided at more than one location around the edge(s) of the substrate and chuck. In practice, the shaped section or integral extension may extend around all the edge(s) of the chuck. That is, the shaped section may form a ring which may be placed around the chuck, or which may form an integral part of the chuck. It can be seen that the shaped section or extension (in whatever form provided) extends away from the edge(s) of the chuck and substrate. The extension or section may extend by any suitable amount. To a limit, the further that the extension or section extends away from the chuck, the more likely it is that gas may be deflected between the imprint template and the imprintable medium. However, up to a certain distance away from the substrate and chuck, any increase in the degree to which the extension or section extends away from the chuck will have little effect. Suitable ranges for the distance which the extension or section extends away from the chuck and substrate are 0.1 cm to 100 cm, and 1 cm to 5 cm may be advantageous.

In FIGS. 4a and 4b, the shape section or extension is shown as having an angled surface which is flat. It will however be appreciated that the shaped section or extension may have an angled surface which is not flat. For example, the shaped section or extension may be provided with a curved surface which may be used to, in use, direct gas in between the imprint template and the substrate. In other words, the shaped section or extension may be used to, in use, direct gas toward (i.e. in the direction of) a normal vector extending from the chuck (and/or the substrate if carried by the chuck).

Figure 5A:
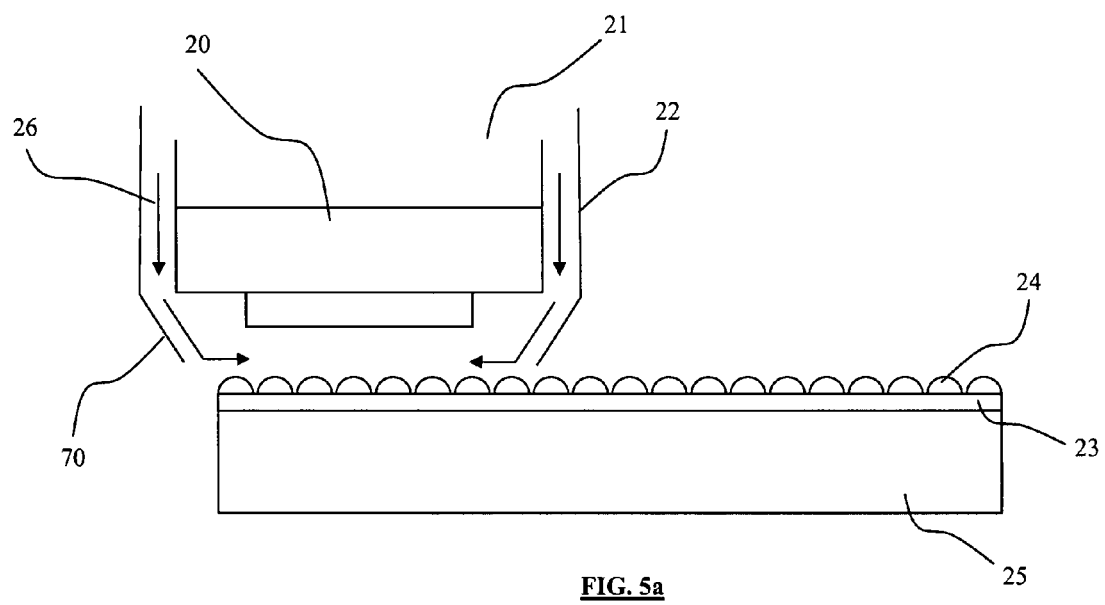
FIGS. 5a-5c depict an imprint lithography apparatus and method according to one or more embodiments of the invention.

FIG. 5a depicts a further embodiment of the present invention. FIG. 5a shows that the conduit(s) 22 through which gas 26 flows towards the substrate 23 is provided with a deflector 70. The deflector 70 is angled inwardly towards the imprint template 20 (e.g. toward an axis passing through the center of the imprint template 20 and extending perpendicularly away from the surface of the imprint template 20). The deflector 70 may be attached to the conduit(s) 22, or be an integral part of the conduit(s) 22.

It can be seen from FIG. 5a that, in use, gas 26 emerging from the conduit(s) 22 is deflected by the deflector 70 such that the gas 26 is directed, for example, underneath the imprint template 20. It can also be seen that the gas 26 is directed, for example, beneath the imprint template 20, and between the imprint template 20 and the substrate 23, even when the imprint template 20 has been used to imprint patterns at the periphery of the substrate 23. This means that, in contrast to conventional methods, the incorporation of the deflector 70 reduces the amount of wasted gas 26, and increases the amount of gas 26 deflected between the imprint template 20 and the substrate 23. Therefore, using the embodiment of the invention, gas inclusions may be eliminated, reduced in number, and/or the time taken for gas inclusions to dissolve may be reduced.

It can be seen from FIG. 5a that all the conduit(s) 22 is provided with the deflector 70. This may not be essential, and in an embodiment, all the conduit(s) 22 may not be provided with a deflector 70. The deflector 70 of the or each conduit 22 may be angled inwardly towards the imprint template 20 at a different angle depending on the location of the conduit 22 and/or deflector 70.

Figure 5B:
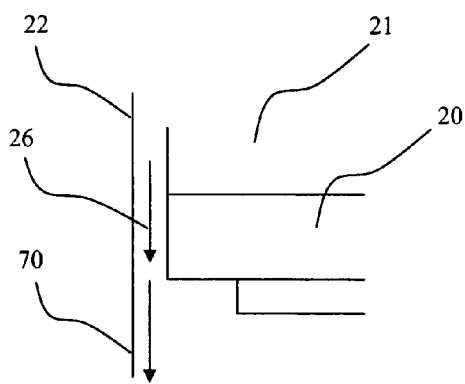
Figure 5C:
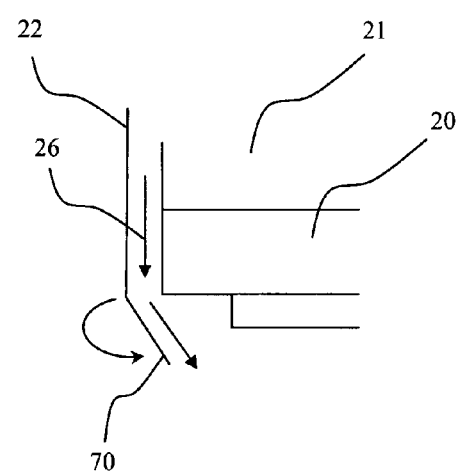

FIGS. 5b and 5c depict a further embodiment of the invention, which is a slight modification of the embodiment described in relation to FIG. 5a above. In FIGS. 5b and 5c, it can be seen that the deflector 70 is moveable. For example, in FIG. 5b it can be seen that the deflector 70 is in alignment with the conduit 22. In contrast, it can be seen that in FIG. 5c the deflector 70 has been rotated inwardly towards the imprint template 20. It may be desirable to change the orientation of the deflector 70 depending on the location of the imprint template 20 relative to the part of the substrate onto which a pattern is to be imprinted. For example, when patterns are being imprinted in or around the center of the substrate, the deflector 70 may not need to be rotated inwardly towards the imprint template 20, and can instead be aligned with the conduit 22. When patterns are to be imprinted on the periphery of the substrate 23, it may be desirable to ensure that gas 26 is deflected between the imprint template 20 and the substrate 23, instead of being able to bypass the substrate 23. The deflector 70 could be rotatable from the first configuration, for example when it is in alignment with the conduit 22 to a second configuration, for example when the deflector 70 is angled inwardly towards the imprint template 20, such that gas 26 is then directed between the imprint template 20 and the substrate 23. Alternatively or additionally, the deflector 70 could be moveable to any particular angle to change the angle of deflection of gas 26 exiting the conduit 22.

FIGS. 5a to 5c depict a deflector and its use for deflecting gas emerging from a conduit. The deflector is not essential. Instead, the conduit could be shaped or oriented such that gas emerges from the conduit and is directed to between the imprint template and the substrate. For example, the conduit could be curved or have an angled section. As with the deflector shown in FIGS. 5b and 5c, the conduit could be moveable from a first configuration, where gas is not directed to between the imprint template and the substrate, to a second configuration, where gas is directed to between the imprint template and the substrate. The conduit could be moved using any sort of actuator.

The conduit, whether moveable or not, and with or without the deflector, may be generically referred to as a gas delivery apparatus. In general, the gas delivery apparatus is arranged to deliver gas in the direction of the imprint template, for example toward an axis passing through the center of the imprint template 20 and extending perpendicularly away from a patterned surface of the imprint template 20 (the patterned region of the imprint template is the part of the imprint template that will be used to imprint a pattern). In other words, the gas delivery apparatus is arranged to deliver gas in the direction of a normal vector extending from a patterned surface of the imprint template. That is, in use, gas is directed in between the imprint template and a surface which the imprint template is to be brought into contact with (e.g. imprintable medium). This is in contrast to conventional methods and apparatus (as, for example, can be seen in FIG. 2), where the gas delivery apparatus delivers gas away from the imprint template. The gas delivery apparatus (e.g. the conduit and/or the deflector) are designed (e.g. shaped and sized) such that they do not impact upon the surface of the substrate during the imprinting process.

One or more of the features of the above embodiments may be combined. For example, the deflector (moveable or not) of FIGS. 5a to 5c could be used in conjunction with the extension/section and/or shaped extension/section of FIGS. 3 and 4.

It will be appreciated by one of ordinary skill in the art that the above embodiments have been described by way of example only. It can be appreciated by one of ordinary skill in the art that various modifications may be made to these and other embodiments without departing from the invention, which is defined by the claims that follow.

What is claimed is:

1. A chuck apparatus to hold a substrate onto which a pattern has been or is to be provided using lithography, the chuck apparatus comprising:
   a first surface portion on which the substrate onto which the pattern has been or is to be provided using lithography, is to be held; and
   a second surface portion adjacent to the first surface portion and extending at least partially around an edge of the first surface portion and which, in use, is arranged to deflect gas over the first surface portion and thus the substrate onto which the pattern has been or is to be provided using lithography that is to be held on the first surface portion, wherein the second surface portion defines a surface which is angled inwardly toward the first surface portion.

2. The chuck apparatus of claim 1, wherein the second surface portion defines a flat surface which is angled inwardly toward the first surface portion.

3. The chuck apparatus of claim 1, wherein the second surface portion defines a curved surface which is angled inwardly toward the first surface portion.

4. The chuck apparatus of claim 1, wherein the first surface portion and second surface portions are integral parts of a chuck which is larger in width than the substrate which the chuck is designed to hold.

5. The chuck apparatus of claim 1, wherein the first surface portion is provided by a chuck, and the second surface portion is provided by a separate extension located adjacent to an edge of the chuck.

6. The chuck apparatus of claim 5, wherein the extension extends around a part of an edge of the chuck.

7. The chuck apparatus of claim 5, wherein the extension extends around the chuck.

8. The chuck apparatus of claim 1, wherein at least the first surface portion constitutes at least a part of an intermediate substrate carrier.

9. The chuck apparatus of claim 1, wherein at least the first surface portion constitutes at least a part of a substrate table.

10. The chuck apparatus of claim 1, arranged to hold a substrate onto which patterns are to be imprinted using imprint lithography.

11. A method of directing gas over a substrate using a chuck apparatus, the chuck apparatus comprising a first surface portion on which the substrate is holdable; and a second surface portion adjacent to the first surface portion and extending at least partially around an edge of the first surface portion, the second surface portion defining a surface which is angled inwardly toward the first surface portion; the method comprising: directing gas at the second surface portion, the second surface portion deflecting gas over the substrate.

12. The method of claim 11, wherein the second surface portion defines a flat surface which is angled inwardly toward the first surface portion.

13. The method of claim 11, wherein the second surface portion defines a curved surface which is angled inwardly toward the first surface portion.

14. The method of claim 11, wherein the first surface portion and second surface portions are integral parts of a chuck which is larger in width than the substrate which the chuck is designed to hold.

15. The method of claim 11, wherein the first surface portion is provided by a chuck, and the second surface portion is provided by a separate extension located adjacent to an edge of the chuck.

16. The method of claim 15, wherein the extension extends around a part of an edge of the chuck.

17. The method of claim 15, wherein the extension extends around the chuck.

18. The method of claim 11, wherein at least the first surface portion constitutes at least a part of an intermediate substrate carrier.

19. The method of claim 11, wherein at least the first surface portion constitutes at least a part of a substrate table.

20. The method of claim 11, further comprising imprinting a pattern on the substrate using imprint lithography.

* * * * *